United States Patent
Mostafazadeh

(10) Patent No.: US 6,468,832 B1
(45) Date of Patent: Oct. 22, 2002

(54) METHOD TO ENCAPSULATE BUMPED INTEGRATED CIRCUIT TO CREATE CHIP SCALE PACKAGE

(75) Inventor: Shahram Mostafazadeh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/620,206

(22) Filed: Jul. 19, 2000

(51) Int. Cl.[7] .............................................. H01L 21/44
(52) U.S. Cl. ..................... 438/112; 438/26; 438/106; 438/108; 438/127; 257/738; 257/778
(58) Field of Search ................. 257/676, 737, 257/790, 788, 738; 438/127, 108

(56) References Cited

U.S. PATENT DOCUMENTS

| | | | | |
|---|---|---|---|---|
| 5,864,174 A | * | 1/1999 | Yamada et al. | 257/676 |
| 6,075,290 A | * | 6/2000 | Schaefer et al. | 257/737 |
| 6,093,972 A | * | 7/2000 | Carney et al. | 257/790 |
| 6,133,634 A | * | 10/2000 | Joshi | 257/738 |
| 6,157,086 A | * | 12/2000 | Weber | 257/788 |
| 6,204,095 B1 | * | 3/2001 | Farnworth | 438/127 |
| 6,245,595 B1 | * | 6/2001 | Nguyen et al. | 438/108 |

* cited by examiner

Primary Examiner—David Nelms
Assistant Examiner—Mai-Huong Tran
(74) Attorney, Agent, or Firm—Beyer Weaver & Thomas, LLP

(57) ABSTRACT

An encapsulated bumped die is provided. Singulated bumped dice are attached to a die attach panel. The die attach panel and dice are placed in a mold, where the bumps are partially flattened. A mold compound is then used to encapsulate the dice and panel. The mold compound is cured. The encapsulated dice are then singulated. The encapsulated dice may then be directly mounted on a substrate such as a PC board. The encapsulation provides added protection to the dice.

20 Claims, 5 Drawing Sheets

US 6,468,832 B1

METHOD TO ENCAPSULATE BUMPED INTEGRATED CIRCUIT TO CREATE CHIP SCALE PACKAGE

FIELD OF THE INVENTION

The present invention relates generally to integrated circuits. More specifically, the invention relates to enclosing integrated circuits.

BACKGROUND OF THE INVENTION

Commonly assigned, U.S. patent application Ser. No. 09/006,759 entitled "A Semiconductor Wafer Having A Bottom Surface Protective Coating", by Kao et al., filed on Jan. 14, 1998, discloses providing a protective coating on a bottom surface of a semiconductor die. In Kao et al., a wafer for flip-chips or surface mount dice is coated on a back side with an epoxy and cured. One of the features of the protective coating is to provide protection from light-induced bias. Such a protective coating does not cover the side of a die. Processing of surface mount dice may make it difficult to provide a protective coating that is opaque.

The micro surface mount die is an extension of flip chip technology where solder bumps on die pads are the means to make electrical connections between the die and a PC board. Thus, the micro surface mount die (SMD) is a true chip size package where the die is the package.

Micro SMD wafers go through normal wafer fabrication processes except that the die pads are redistributed to create a standard pattern of the bumps. Bumps are then provided on the die pads. After the bumping process is completed, the back of the wafer may be coated with epoxy and cured. The wafer may then be singulated to form bumped dice.

To facilitate discussion, FIG. 1 is a cross-sectional view of a singulated micro surface mount die 10 with a bottom surface coating 12. Solder balls 14 have been mounted to the top side of the surface mount die 10.

Commonly assigned, U.S. patent application Ser. No. 09/359,074, entitled "Techniques For Wafer Level Molding Of Underfill Encapsulant", by Luu Nguyen et al., filed Jul. 22, 1999, discloses the placing of an encapsulant on a plurality of flip chips in a wafer. The wafer is then singulated to provide protected flip chips. Such protection may not be provided on the sides of the singulated chip.

Other methods of protecting surface mounted dice may be provided by the use of underfill or glob top processes. In an underfill process, underfill material is placed within a gap between a bumped device and a substrate. The gap may be small, and the underfill process may be slow. The resulting underfill process may not provide protection to the back side of the bumped die. The glob top process may be used to provide a plastic glob over a bumped device that has been mounted on a substrate. Using the glob top process on every mounted bumped device may slow the manufacturing process.

It would be desirable to provide protection for a bumped chip (flip chip or surface mount die) that provides protection on all sides of a bumped chip. It would also be desirable to provide a heat sink for a bumped chip.

SUMMARY OF THE INVENTION

To achieve the foregoing and other objects and in accordance with the purpose of the present invention, a variety of techniques is provided for providing encapsulated bumped dice. Generally, singulated bumped dice are mounted on a die attach panel. The bumped dice and die attach panel are then encapsulated in a mold compound. The encapsulated dice are then singulated.

Another embodiment of the invention provides a die with partially flattened bumps connected to a die attach pad, where the die, die attach pad and part of the partially flattened bumps are encapsulated.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
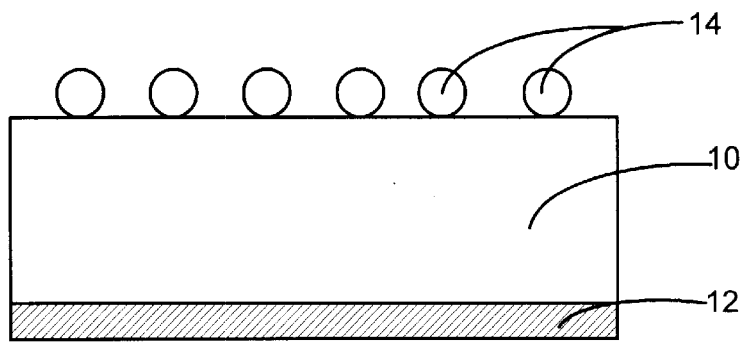
FIG. 1 is a cross-sectional view of a singulated micro surface mount die used in the prior art.
Figure 2:
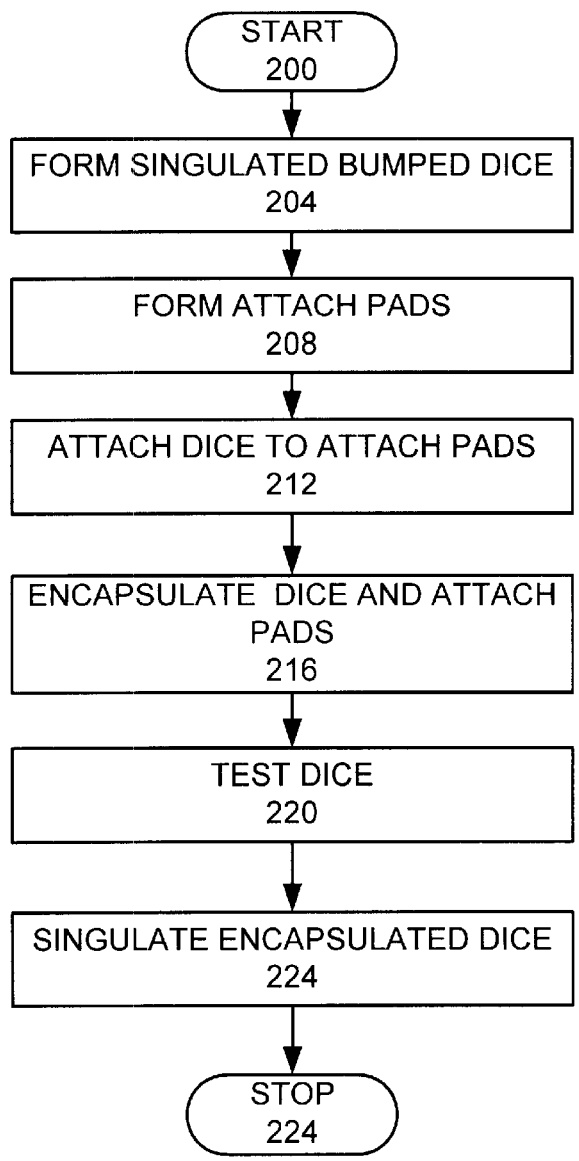
FIG. 2 is a flow chart of a method used in a preferred embodiment of the invention.
Figure 3:
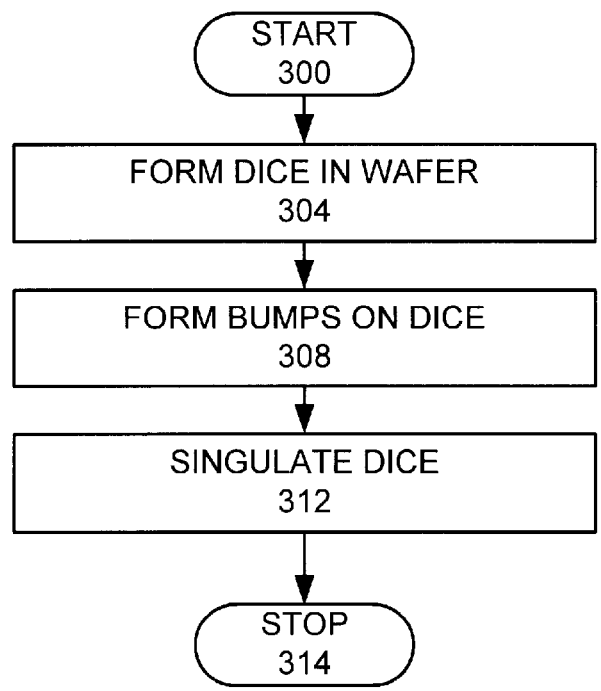
FIG. 3 is a flow chart of a method used to provide singulated bumped dice.
Figure 4:
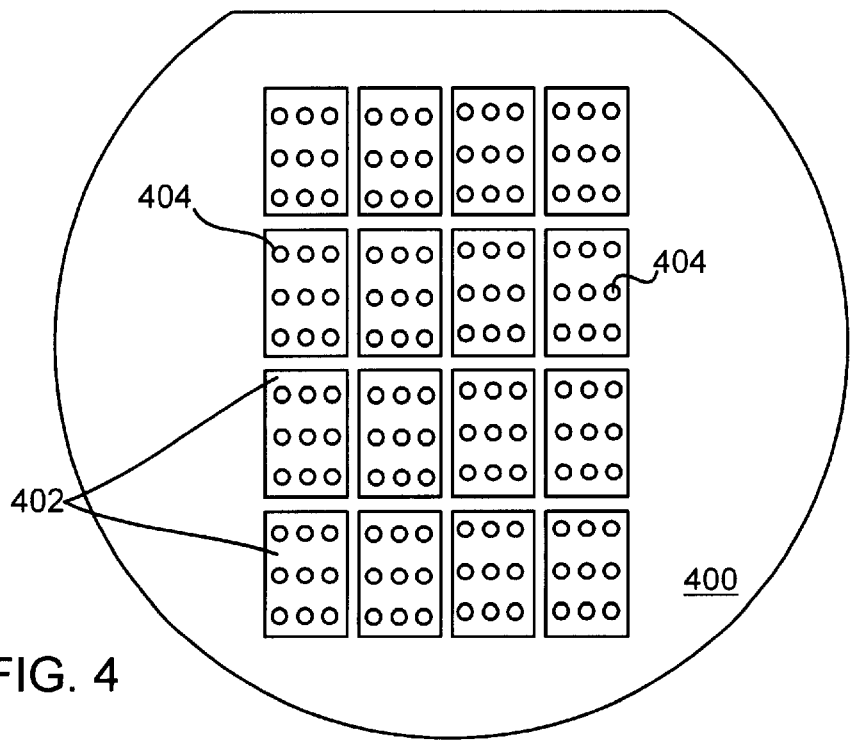
FIG. 4 is a plan view of a wafer with bumped dice.

To facilitate discussion, FIG. 2 is a flow chart of a method used in a preferred embodiment of the invention. According to the flow chart of FIG. 2, a plurality of singulated bumped dice is formed (step 204). FIG. 3 is a flow chart for the formation of a plurality of bumped dice that is used in an embodiment of the invention. A wafer is formed with a plurality of dice (step 304). FIG. 4 is a plan view of a wafer 400 with a plurality of dice 402. Bumps of conductive material, such as solder bumps 404, are formed on attach pads of the dice 402 (step 308). The wafer 400 is the cut to singulate the bumped dice 402 (step 312). In other embodiments, these steps may be done in a different order, such as singulating the dice before adding the bumps of conductive material.

Figures 5, 6:
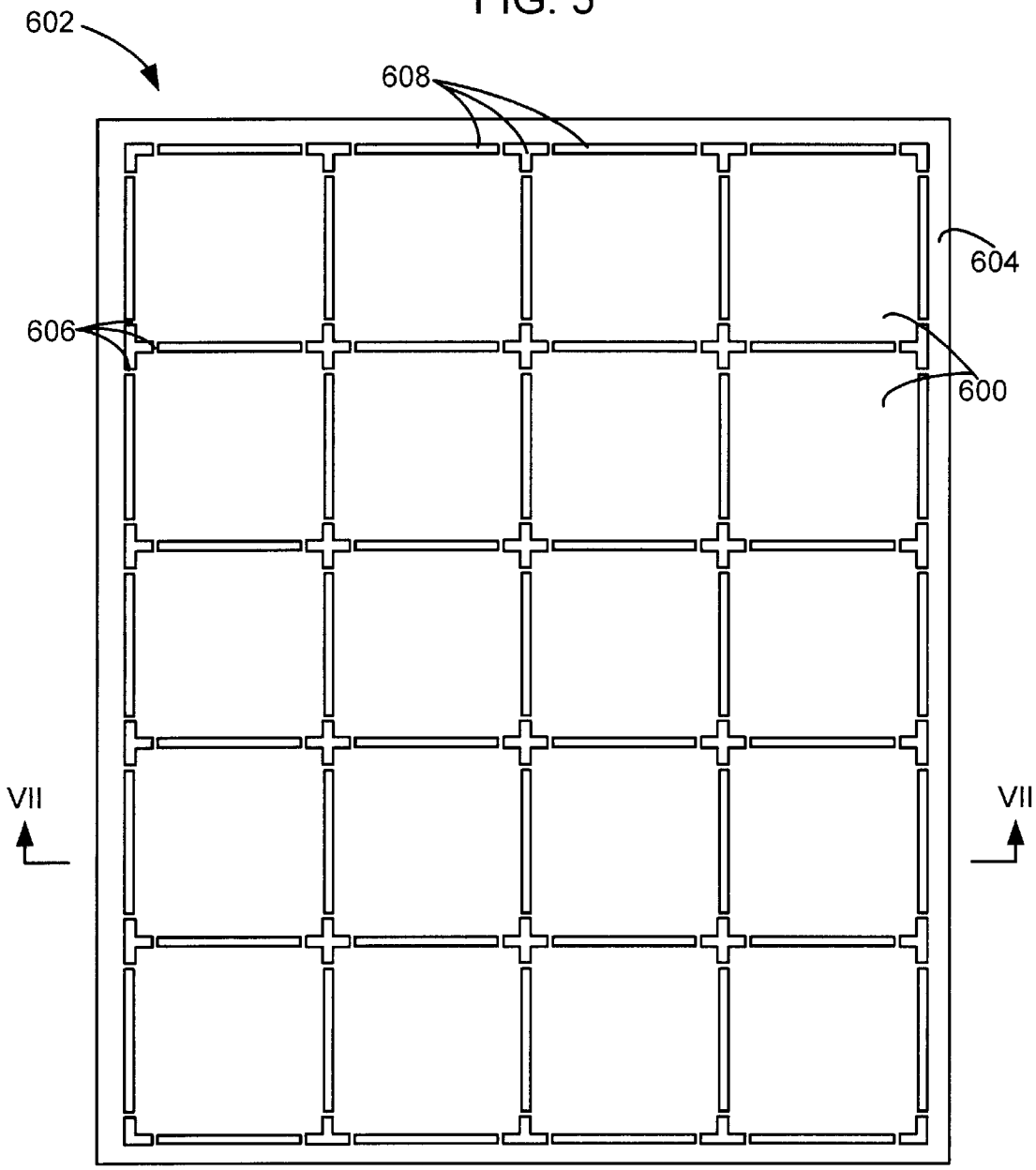
FIG. 5 is a cross-sectional view of a surface mount die used in the preferred embodiment of the invention.
FIG. 6 is a top view of a die attach panel.

FIG. 5 is a cross-sectional view of a bumped die 402, that has been singulated. The solder bumps 404 are attached to mounting pads on a top side of the bumped die 402. Generally, for all dice used in the preferred embodiment of the invention, the dice have a single active side, which has pads such as connection pads for conductive bumps or bond pads for wire bonding. The top side is defined as the active side of the die 402 and the bottom side is defined as the side opposite from the active side.

Figure 7:
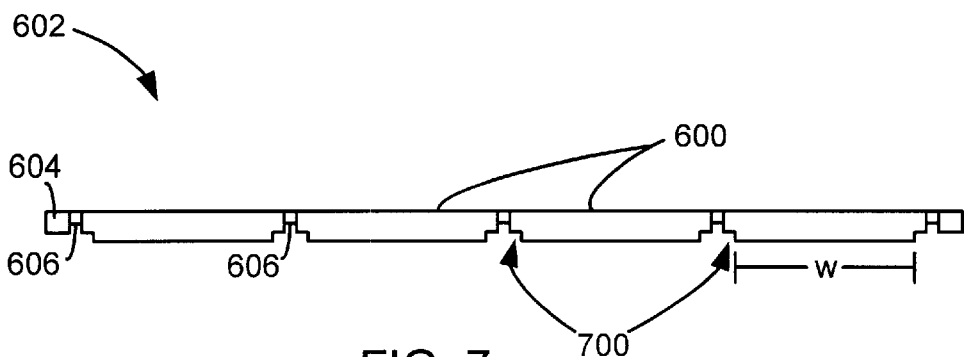
FIG. 7 is a cross-sectional view of the die attach panel of FIG. 6 along cut lines VII—VII.

Die attach pads may then be formed (step 208). FIG. 6 is a top view of a plurality of die attach pads 600 formed as a die attach panel 602, comprising a plurality of die attach pads 600 supported by a pad frame 604, and tie bars 606 crossing apertures 608 and connecting the die attach pads 600 to the pad frame 604 and to other die attach pads 600. FIG. 7 is a cross-sectional view of the die attach panel, along cut lines VII—VII. The die attach panel 602 may be formed from a plated metal, such as a copper sheet or Alloy 42, that is stamped or etched to form the pad frame 604, tie bars 606, and die attach pads 600. Conventional lead frame manufacturing equipment may be used to form the die attach panel 602. In the alternative, the die attach panel may be made of molded plastic or ceramic. In an example of dimensions that may be used, the width "w" of a die attach pad 600 may be between 25 to 300 mils (635 microns to 7620 microns). Preferably, the pad frame 604 has a locking feature 700, which in this embodiment are grooves formed by the edges of the die attach pads 600.

Figure 8:
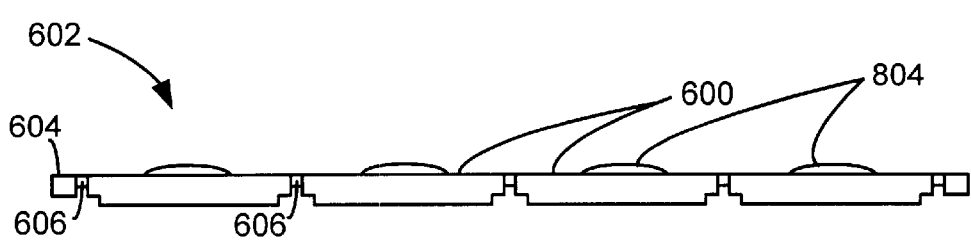
FIG. 8 is a cross-sectional view of the die attach panel with adhesive placed on each die attach pad.
Figure 9:
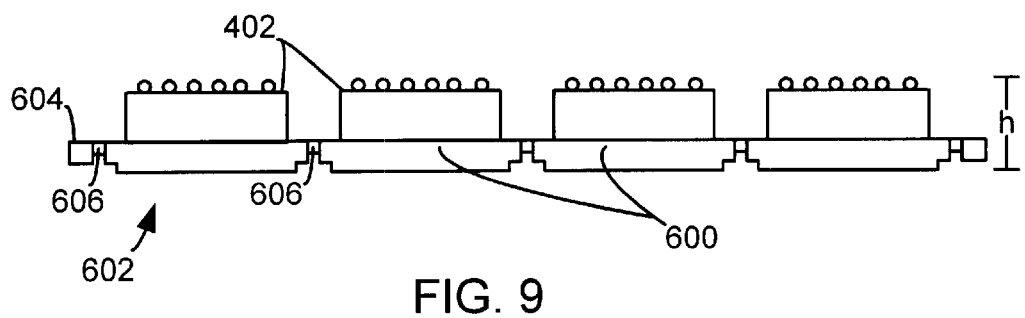
FIG. 9 is a cross-sectional view of the die attach panel with a die attached to each die attach pad.

The bumped dice 402 are then attached to the die attach pads 600 (step 212). The die attach panel 602 may be placed in conventional die attach equipment. Conventional die attach equipment may be used to place an adhesive on each die attach pad 600. FIG. 8 is a cross-sectional view of the die attach panel 602 with adhesive 804 placed on each die attach pad 600. The adhesive may be an epoxy or another conventional adhesive. Conventional die attach equipment may also be used to place a die on each pad. FIG. 9 is a cross-sectional view of the die attach panel 602 with a die 402 attached to each die attach pad 600. The die attach panel 602 with the dice 402 have a total height "h", as shown. The backside of the dice 402 are connected to the die attach pad 600. The adhesive may be a snap type adhesive, which may be cured using a snap cure or an adhesive, which is cured in an oven. Preferably, the dice 402 are slightly smaller in width than the die attach pad 600.

Figure 10:
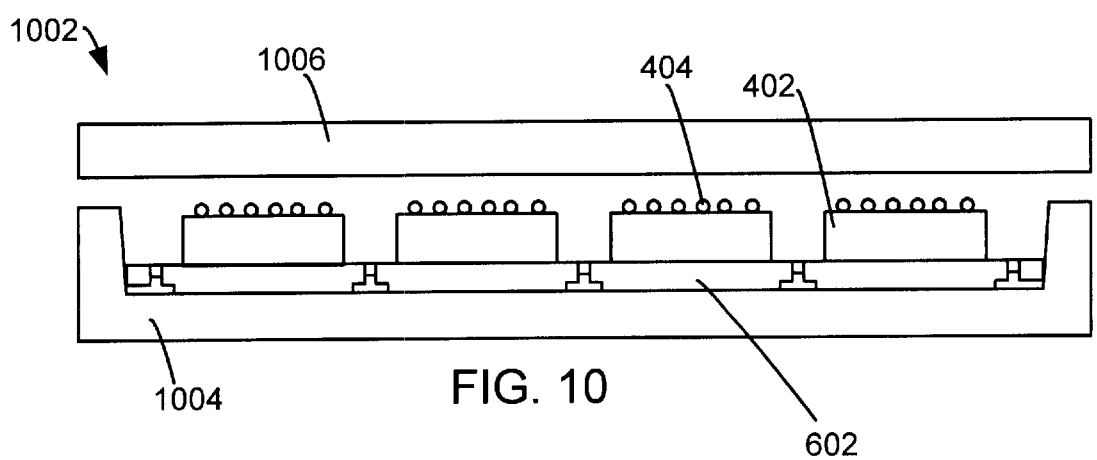
FIG. 10 is a cross-sectional view of the die attach panel with attached dice in a mold.
Figure 11:
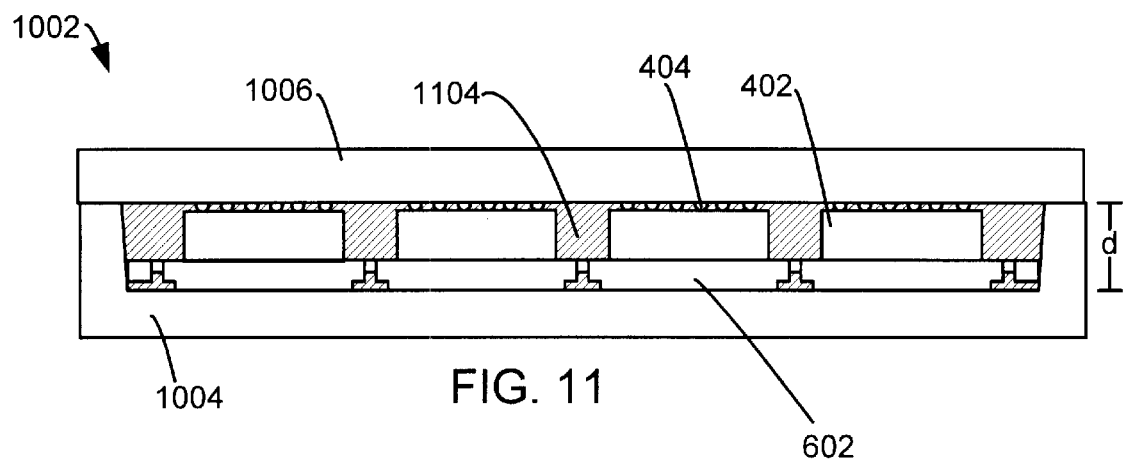
FIG. 11 is a cross-sectional view of the die attach panel with attached dice in a closed mold and an injected mold compound.

Next, the dice and attach pads are encapsulated (step 216). FIG. 10 is a cross-sectional exploded view of a die attach panel 602, with dice 402 in a mold 1002 with a bottom platen 1004 and a top platen 1006. The bottom platen 1004 is designed so that it will accept the die attach panel 602 with the dice 402. The bumps 404 extend slightly above the top of the bottom platen 1004, as can be seen in FIG. 10. FIG. 11 is a cross-sectional view of the closed mold 1002 where the top platen 1006 is placed on the bottom platen 1004. The top platen 1006 has a flat surface, which contacts the bumps 404 and flattens the bumps 404 about the amount that the bumps extended above the top of the bottom platen 1004. This is why the bumps 404 extended slightly above the top of the bottom platen 1004. More generally, the distance from an inner surface of the bottom platen 104, upon which the die attach panel 602 rests, to an inner surface of the top platen 1006, which contacts the bumps, is a distance "d", which is slightly less than the total height "h" of the die attach panel 602 and dice 402, so that the bumps 404 will be partially flattened by the top platen 1006. A mold compound 1104 is then injected into the mold cavity. The mold compound 1104 is able to pass through the apertures 608 (FIG. 6) in the die attach panel 602. By allowing the mold compound to pass through the apertures 608 to fill the locking feature 700, the mold compound is able to more securely hold the die attach pads after singulation.

The encapsulated die attach panel 602 and dice 402 may be removed from the mold 1002, where the mold compound may be cured. The dice 402 may be tested as a panel before singulation (step 220). Testing the dice 402 before singulation may allow testing in panel form, which may be easier than testing after singulation.

Figure 12:
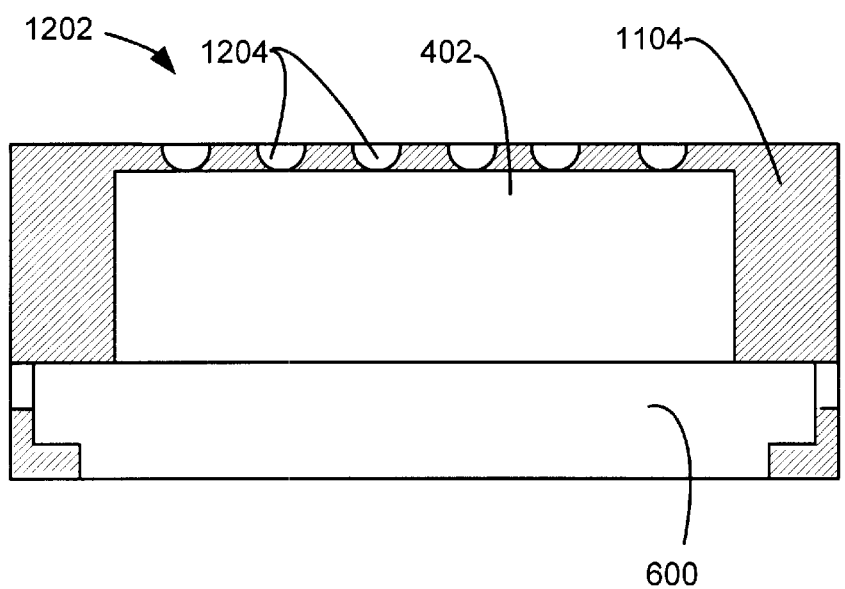
FIG. 12 is a cross-sectional view of an encapsulated die after singulation.

The encapsulated dice are then singulated (step 224). FIG. 12 is a cross-sectional view of an encapsulated bumped die 1202, comprising the bumped die 402, a die attach pad 600, and mold compound 1104 after singulation. Conventional equipment such as wafer saws or lasers may be used to cut through the mold compound 1104 and tie bars 606 to singulate the encapsulated dice 402.

The encapsulated bumped die 1202 may be placed on a substrate, such as a ceramic substrate or a PC board, with the flattened bumps 1204 of the bumped die 402 placed against bond pads or some other electrical connection of the substrate. A conductive paste may be placed between the bond pad of the substrate and the flattened bumps 1204 or the flattened bumps 1204 may be reflowed.

The mold compound provides protection to the bumped die 402 on all sides of the bumped die. Such protection would be optical protection and mechanical protection. Optical protection provided by the mold compound 1104 shielding the die from light, since the die may be affected by light. Mechanical protection shields the die from contact with other objects, which might chip the die. The mold compound also provides mechanical support between the die 402 and the flattened bumps 1204 to help reduce thermal stress between the die 402 and the flattened bumps 1204. The die attach pads provide a thermal sink to help keep the die cool, thus improving thermal performance. The flattening of the bumps creates a uniform bump height. This added protection is provided without requiring underfill or glob top processes, allowing for easier and faster placement of the dice.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for providing encapsulated bumped dice, comprising:

providing a plurality of singulated bumped dice wherein each bumped die has an active top side with a plurality of conductive bumps and a bottom side opposite from the top side;

attaching the bottom sides of some of the plurality of singulated bumped dice to a die attach panel;

encapsulating the plurality of dice attached to the die attach panel in a mold compound; and singulating the encapsulated dice.

2. The method, as recited in claim 1, wherein the encapsulating the plurality of dice, comprises:

placing the singulated bumped dice attached to the die attach panel in a mold; and injecting a molding compound into the mold.

3. The method, as recited in claim 2, wherein the placing the singulated bumped dice attached to the die attach panel into the mold, at least partially flattens the conductive bumps.

4. The method, as recited in claim 3, wherein the placing the singulated bumped dice attached to the die attach panel into a mold, comprises:

placing the singulated bumped dice attached to the die attach panel on a first platen, wherein the singulated bumped dice attached to the die attach panel has a total height and wherein the first platen has an inner surface upon which the die attach panel rests; and placing an inner surface of a second platen against the plurality of conductive bumps of the bumped dice, wherein the distance between the inner surface of the first platen and the inner surface of the second platen is less than the total height of the singulated bumped dice attached to the die attach panel, and wherein the first platen and second platen form a cavity surrounding the bumped dice attached to the die attach panel, wherein the inner surface of the first platen and the inner surface of the second platen form part of the cavity.

5. The method, as recited in claim 4, further comprising the step of curing the mold compound.

6. The method, as recited in claim 5, further comprising forming the die attach panel, comprising:

forming a plurality of die attach pads; and forming a plurality of ties connected between the die attach pads, wherein a plurality of apertures are formed between the ties, and where during the encapsulating the plurality of dice mold compound passes through the plurality of apertures.

7. The method, as recited in claim 6, further comprising the step of testing the plurality of bumped dice as a panel before singulating the encapsulated dice.

8. The method, as recited in claim 7, wherein the attaching the bottom sides of some of the plurality of singulated bumped dice to a die attach panel, comprises placing an adhesive between the bottom sides of some of the plurality of singulated bumped dice and the die attach pads.

9. The method, as recited in claim 8, wherein the providing a plurality of singulated bumped dice, comprises:

forming dice in a wafer;

attaching conductive bumps to the dice; and singulating the dice.

10. The method, as recited in claim 9, wherein the forming the die attach panel, forms the die attach pads and ties from a metal sheet.

11. The method, as recited in claim 10, wherein the step of attaching conductive bumps attaches solder bumps.

12. The method, as recited in claim 11, wherein the step of encapsulating forms a surface of the molding compound which forms a single flat surface with surfaces of the partially flattened bumps.

13. The method, as recited in claim 1, further comprising forming the die attach panel from a metal sheet, comprising:

forming a plurality of die attach pads; and forming a plurality of ties connected between the die attach pads.

14. The method, as recited in claim 1, further comprising the step of testing the plurality of bumped dice as a panel before singulating the encapsulated dice.

15. The method, as recited in claim 1, wherein the step of encapsulating partially flattens the bumps and forms a surface of the molding compound which forms a single flat surface with surfaces of the partially flattened bumps.

16. An encapsulated bumped die, comprising:

a die with an active top side and a bottom side opposite the top side, wherein the die comprises a plurality of bond pads on the top side of the die;

a plurality of partially flattened bumps wherein each partially flattened bump is connected to a bond pad of the plurality of bond pads;

a die attach pad connected to the bottom of the die; and an encapsulant surrounding the sides of the die and at least partially surrounding the die attach pad and surrounding all of each partially flattened bump of the plurality of partially flattened bumps except for the flattened parts of the plurality of partially flattened bumps.

17. The encapsulated bumped die, as recited in claim 16, wherein the die attach pad is metal.

18. The encapsulated bumped die, as recited in claim 17, wherein the partially flattened bumps are solder.

19. The encapsulated bumped die, as recited in claim 18, further comprising adhesive connected between the die and the die attach pad.

20. The encapsulated bumped die, as recited in claim 19, wherein a surface of the encapsulant and surfaces of the plurality of partially flattened bumps form a single flat surface.

* * * * *